United States Patent [19]

Thornton et al.

[11] Patent Number: 5,317,586
[45] Date of Patent: May 31, 1994

[54] BURIED LAYER III-V SEMICONDUCTOR DEVICES WITH IMPURITY INDUCED LAYER DISORDERING

[75] Inventors: Robert L. Thornton, East Palo Alto; Fernando A. Ponce, Sunnyvale, both of Calif.

[73] Assignee: Xerox Corporation, Stamford, Conn.

[21] Appl. No.: 928,906

[22] Filed: Aug. 12, 1992

[51] Int. Cl.$^5$ .............................................. H01S 3/19
[52] U.S. Cl. ....................................... 372/45; 372/46; 372/44
[58] Field of Search ............................... 372/45, 46, 44

[56] References Cited

U.S. PATENT DOCUMENTS

| | | | |
|---|---|---|---|
| 4,830,983 | 5/1989 | Thornton | 437/161 |
| 4,871,690 | 10/1989 | Holonyak, Jr. et al. | 437/105 |
| 4,980,893 | 12/1990 | Thornton et al. | 372/50 |
| 4,987,468 | 1/1991 | Thornton | 372/45 |
| 5,048,035 | 9/1991 | Sugawara et al. | 372/45 |
| 5,107,514 | 4/1992 | Goto | 372/46 |

OTHER PUBLICATIONS

S. R. Chinn, P. S. Zory, and A. R. Resinger, IEEE Jour Quantum Electronics 24, 2191–2214 (1988).
P. J. A. Thijs, L. F. Theimeijer, P. I. Kuindersma, J. J. M. Binsma, and T. van Dongen, IEEE Jour, Quantum Electronics 27, 1426–1439 (1991).
L. F. Teimeijer, P. J. A. Thijs, P. J. de Waard, J. J. M. Binsma, and T. van Dongen, Appl. Phys. Lett. 58, 2738–2740 (1991).
M. J. B. Boermans, S. H. Hagen, A. Valster, Mn. N. Finke, and J. M. M. van der Heyden, Electronics Lett. 26, 1438–1439 (1990).
D. F. Welch, T. Wang, and D. R. Scifres, Electronics Lett. 27, 693–695 (1991).
M. Kondo, K. Domen, C. Anayama, T. Tanahashi, and K. Nakajima, Jour. Crystal Growth 107, 578–582 (1991).
Masao Ikeda, Yoshifumi Mori, Hiromitsu Sato, Kunio Kaneko, and Naozo Watanabe, Appl. Phys. Lett. 47 (10), 0003–6951, (1985).
S. A. Schwarz, P. Mei, T. Venkatesan, R. Bhat, D. M. Hwang, C. L. Schwartz, M. Koza, L. Nazar, and B. J. Skromme, InGaAs/InP Superlattice Mixing Induced by Zn or Si diffusion, Physics Dept., Rutgers University, (1988).
R. L. Thornton, F. A. Ponce, G. B. Anderson and F. J. Endicott, Strain and Defect Generation During Interdiffusion of GaAs into Al$_5$In$_5$P, (Submitted to Applied Physics Letters, May 13, 1992).

(List continued on next page.)

*Primary Examiner*—Georgia Y. Epps
*Attorney, Agent, or Firm*—Rosen, Dainow & Jacobs

[57] ABSTRACT

A buried-layer semiconductor structure solving the problem of defect and dislocation generation which typically results when impurity induced layer disordering occurs across interfaces where there are changes in both the column III and the column V constituents in the manufacture of III-V compound semiconductors, for use, for example, in lasers. The structure is characterized by a thin buried active layers entirely bounded by thick layers on a substrate. Defect generation is avoided by maintaining the thin layer below a critical thickness and lattice matching the thick layers to the substrate.

As a further feature, the problem of relatively poor thermal conductivity in AlGaInP based laser structures is avoided by minimizing the amount of AlGaInP material contained in the laser structure, restricting these materials only to the critical active layers, and using AlGaAs for the majority of the optical guiding and carrier confining layers.

As a further feature, high levels of p-type doping in AlInP, which is desired because of its low refractive index, is obtained by replacing AlInP layers with AlGaAs layers of high aluminum composition and therefore comparable refractive index.

28 Claims, 5 Drawing Sheets

OTHER PUBLICATIONS

S. H. Pan, H. Shen, Z. Hang, F. H. Pollak, W. Zhuang, Q. Xu, A. P. Roth, R. A. Masut, C. Lacelle, and D. Morris, Phys. Rev. B-38, 3375-3382 (1988).

S. W. Corzine and L. A. Caldren, Appl. Phys. Lett., 59, 588-590 (1991).

H. C. Casey, Jr. and M. B. Panish, Heterostructure Lasers Part A: Fundamental Principles, Academic Press Orlando, Fla. (1978) pp. 79-82.

"GaInAsP Alloy Semiconductors", T. P. Pearsall, ed. John Wirley & Sons, NY (1982) pp. 61-106.

H. C. Casey, Jr. & M. B. Panish, "Heterostructure Lasers part B: Materials & Operating Characteristics", Academic Press, Orlando, Fla. (1978) pp. 132-148.

Robert L. Thornton, Integrated Optoelectronics for Communication and Processing, The International Society for Optical Engineering, SPIE vol. 1582, pp. 194-205, (1991).

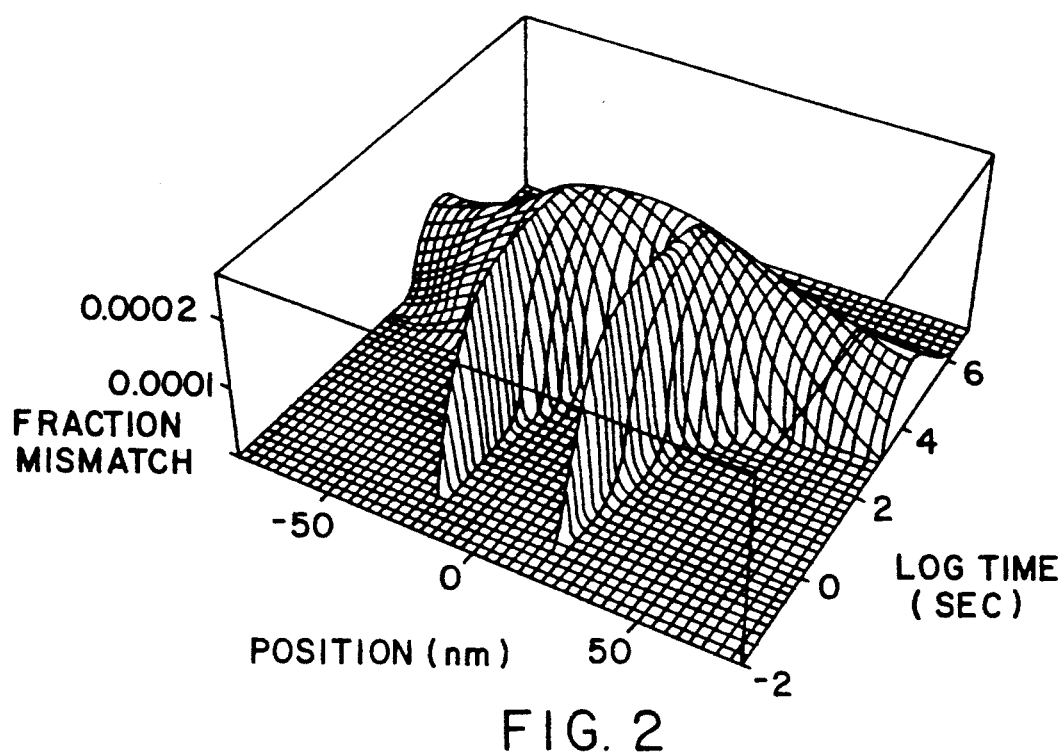
FIG. 2
FIG. 3
PRIOR ART
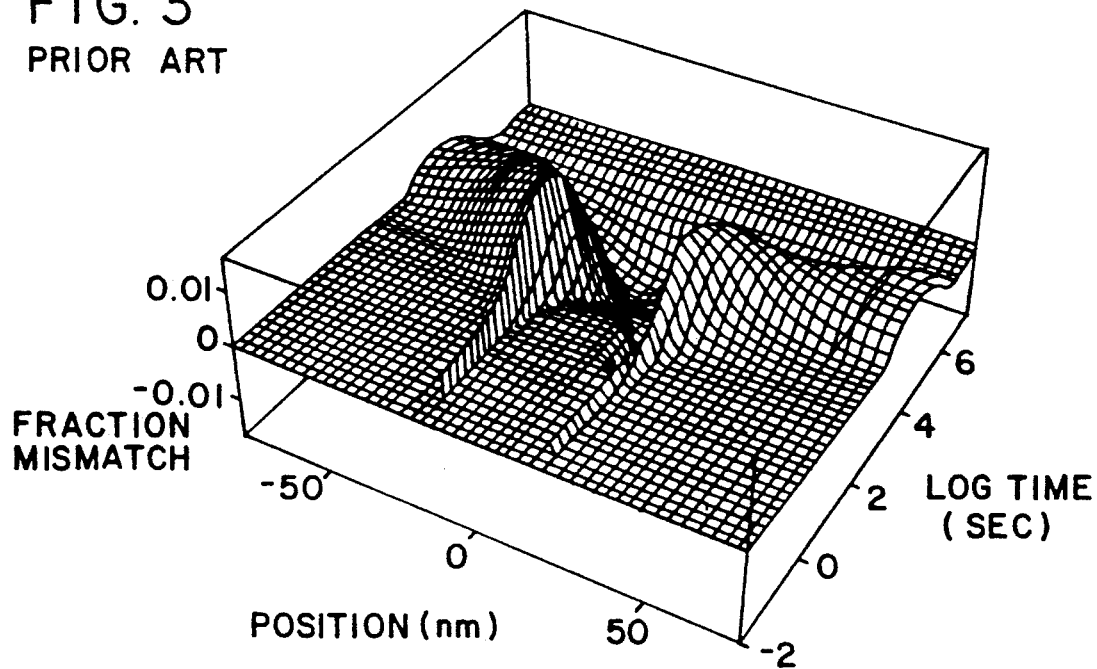

| Refractive Index | Bandgap | Conventional | | | Reduced Column V-P | | Refractive Index | Bandgap |
|---|---|---|---|---|---|---|---|---|
| 3.7 | 1.42ev | GaAs Cap | 30' | 30 | GaAs | | | |
| 3.25 | 1.91 | GaIn P Cap | 29' | 29 | GaAs | | | |
| 3.25 | 2.32 | Al.5In.5P Clad | 28' | 28 | Al.55Ga.15As Clad | 3.25 | 2.11ev | |
| | | | | 27 | Al.35Ga.15In.5P Barrier 80Å | 3.35 | 2.27 | |
| 3.35 | 2.27 | Al.5Ga.5In.5P Waveguide | 26' | 26 | Al.5Ga.5As 700Å | 3.59 | 2.00 | |
| 3.62 | 1.91 | GaInP Well 80Å | 25' | 25 | GaIn P Well | | | |
| | | Al.35Ga.35In.35P Waveguide | 24' | 24 | Al.5Ga.5As 700Å | | | |
| | | | | 23 | Al.35Ga.15In.5P Barrier 80Å | | | |
| | | Al.5In.5P clad | 22' | 22 | Al.85Ga.15As Clad | | | |
| | | Substrate | 21' | 21 | Substrate | | | |

FIG. 4
PRIOR ART                    INVENTION

- ⊠ n-type Si diffused
- ▦ p-type Zn compensated
- = = disordered active region
- − − proton bombardment

- ⊠ Si Diffused Region
- ⊘ Proton Implanted Region

BURIED LAYER III-V SEMICONDUCTOR DEVICES WITH IMPURITY INDUCED LAYER DISORDERING

This invention relates to semiconductor structures. In particular, it relates to the fabrication of buried layer structures in III-V alloy systems relying for their operation on the presence of impurity induced layer disordering to impart desirable and valuable properties to the resultant structures.

BACKGROUND OF INVENTION

The process of impurity induced layer disordering (IILD) has been applied to the fabrication of a wide variety of device structures, primarily in the AlGaAs alloy system. The relative ease with which this process is used in this system is in large part due to the close lattice match between the two binary constituents, AlAs and GaAs. Lattice match is therefore maintained throughout the interdiffusion process. For a more complete description of IILD, its benefits and applications, and how to produce the desired structures by various known treatments, see the detailed descriptions given in two commonly-owned U.S. Pat. Nos. 4,871,690 and 4,830,983, the contents of which patents are hereby incorporated by reference. The '690 patent also describes the manufacture of laser structures from the resultant semiconductor material with the IILD regions. The '983 patent also describes in detail specific processing techniques to control diffusion profiles for systematic reproduction. Also incorporated herein by reference is commonly-owned U.S. Pat. No. 4,980,893, which describes in detail the fabrication of multi-emitter laser arrays useful for high speed raster output scanners (ROS) and laser printing applications from the IILD material. This patent also shows the importance of p-side up mounting, whose significance will become apparent from the description that follows below.

Reference is also made to the previously published paper "Planar Diffusion-Based Processes For The Fabrication of Integrated Optical And Electrical Components", SPIE. Vol. 1582 Integrated Optoelectronics for Communication and Processing, pages 194-205, Sept. 1991. This paper, whose contents are hereby incorporated by reference, explains at great length the benefits of IILD in the fabrication of buried layer devices such as heterostructure lasers, FETs, and heterojunction bipolar transistors. What characterizes this class of devices is a very thin active region bounded on both sides by much thicker material layer. In the case of the laser, the thin region is a narrow filament of laser active region material surrounded on all sides by a material of wider bandgap. Laser action results from population inversion induced in the active region by introduced carriers. The inversion enables light amplification by stimulated emission, which means that light must be waveguided by the very thin region. Waveguiding is accomplished by the surrounding higher bandgap material which also has a lower refractive index and thus acts as an optical waveguide which maintains light in overlap with the thin active region, thus providing for amplification of light within the waveguide. In the FET application, the buried thin active region acts as the FET channel. In the bipolar transistor, it is the thin buried base region of the device, the thinner the base, the higher the operating frequency. In the laser application the active thin layers are one or more thin quantum well (QW) layers as well as possible thin barrier layers.

The performance of such buried layer III-V devices is profoundly affected by the quality of the semiconductor material. Defects, which includes dislocations, in the thin active layer or bounding layers materially affect laser light emission, transistor gain and in general device functionality. Many such devices must be made substantially defect-free in order that they have useful applications. The combination of a buried layer III-V device made by IILD, it has been observed, has a tendency to produce undesired defects under many circumstances involving systems other than the AlGaAs system mentioned above.

In more complicated III-V alloy systems in which the lattice parameter depends much more strongly on the proportions of the binary constituents, the process of enhancing the constituent interdiffusion rate can result in substantial strain within the crystal, potentially leading to threading dislocation and misfit dislocation formation. This becomes particularly the case when lattice parameter matching is accomplished through gradients in both the column III and the column V lattice constituents, as is the case at a GaInP/GaAs interface. In such cases, lattice strain during interdiffusion across the interface is minimal only when the enhanced rates of interdiffusion on both the column III and column V sites are equal. This is difficult to control because the relative rates of interdiffusion are typically a function of the concentrations of various point defect species such as $V_{aIII}$ or $I_{III}$. These point defects typically affect diffusion on III-sites and V-sites in fundamentally different ways. However, such structures incorporating phosphorus (P), such as with an AlInP, InGaAsP, or InGaP layer are highly desirable components as a result of their bandgap properties, as it results in light-emitting lasers emitting in wavelength ranges unavailable with AlGaAs, especially in the visible or further into the infra-red. Emission in the visible range is specially important for applications such as ROS. See, for instance, the Ikeda et al paper, published in App. Phys. Lett., 47(10), Nov. 15, 1985, pp. 1027-1028, which describes the fabrication of a room-temperature CW short wavelength DH laser in GaInP/AlGaInP grown on a GaAs substrate, the contents of which paper are incorporated herein by reference.

It is noted that Schwarz et al, in a paper entitled "InGaAs/InP Superlattice Mixing Induced By Zn or Si Diffusion", Appl. Phys.Lett., Vol 53, No. 12, pages 1051-1053, 1988, observed that in the InGaAs/InP system, in the fabrication of a superlattice structure, a 3.1% lattice mismatch can be accommodated in the mixed superlattice with no observable defects in the examined superlattice layers provided that the individual layer thickness was maintained below about 6-7 nm. It will be understood, however, that this teaching applies to a superlattice structure, which is a succession of thin layers bounded by thin layers, except for the bottommost layer or substrate. The superlattice structure is not commonly used to make semiconductor laser or transistor devices, which require that one or more thin layers must be bounded on both sides by thick layers for proper and efficient device operation, and, moreover, that the thick bounding layers must also be free of defects for the devices to operate properly. The Schwarz et al paper provides no teachings of how to achieve the foregoing, nor does it provide a teaching for III-V systems other than the one system described in the paper.

The InGaAs/InP system is not suitable for visible light-emitting laser diodes as that compositional system would emit in the far infared region.

SUMMARY OF INVENTION

An object of the invention is a buried layer semiconductor structure and method of making thereof relying on IILD in III-V alloy materials and being substantially free of detrimental defects.

Another object of the invention is to minimize strain and defect generation in III-V semiconductor alloy materials when IILD occurs across interfaces involving changes in both the III and V constituents.

A further object of the invention is an AlGaAs based visible light-emitting laser structure with good performance as a result of employing P as a constituent in its thin buried active layer.

In accordance with one aspect of the present invention, the problem of defect and dislocation generation which typically results when IILD occurs across interfaces where there are changes in both the column III and the column V constituents is solved by keeping all thin layers bounding such interfaces below a critical thickness for the strained layer which results when the layers are interdiffused. This approach proves to be of great advantage to the manufacture of visible light-emitting laser structures in which the buried active thin layer is a quaternary alloy AlGaInP. However, the invention is not limited to this application, because such III-V alloy compositions are useful in other buried layer applications where performance is spoiled by the presence of defects or dislocations, and it is the intention to include such other materials and applications within the scope of this invention.

In fabricating laser structures based on quaternary AlGaInP, it appears that the latter has a relatively poor thermal conductivity, which limits the amount of drive current that can be used to excite laser action. In accordance with a further aspect of the invention, this problem is mitigated or solved by minimizing the amount of AlGaInP material contained in the laser structure, restricting these materials only to the critical active layers, and using AlGaAs for the majority of the optical guiding and carrier confining layers.

AlInP offers the lowest refractive index of the AlGaInP alloy system, and is therefore desirable for its waveguide properties. In fabricating semiconductor structures using AlInP, however, a problem arises that it is difficult to achieve high levels of p-type doping in that material, to obtain desirable properties of electrical conductivity. In accordance with another aspect of the present invention, this problem is solved by replacing AlInP layers with AlGaAs layers of high aluminum composition and therefore comparable refractive index.

These and further objects and advantages of the invention will be best understood in connection with the detailed description that follows of several embodiments of the invention, taken in conjunction with the accompanying drawings.

SUMMARY OF DRAWINGS

In the drawings:

FIG. 2 shows a computer simulation of the strain induced in an ideal structure which afforded uniform and simultaneous IILD;

FIG. 3 shows a computer simulation similar to that of FIG. 2 for a real-world structure according to the prior art;

FIG. 4 shows, side-by-side, properties and thicknesses of a conventional prior art structure and one following the teachings of the present invention;

DETAILED DESCRIPTION OF PREFERRED EMBODIMENTS

Figure 1:
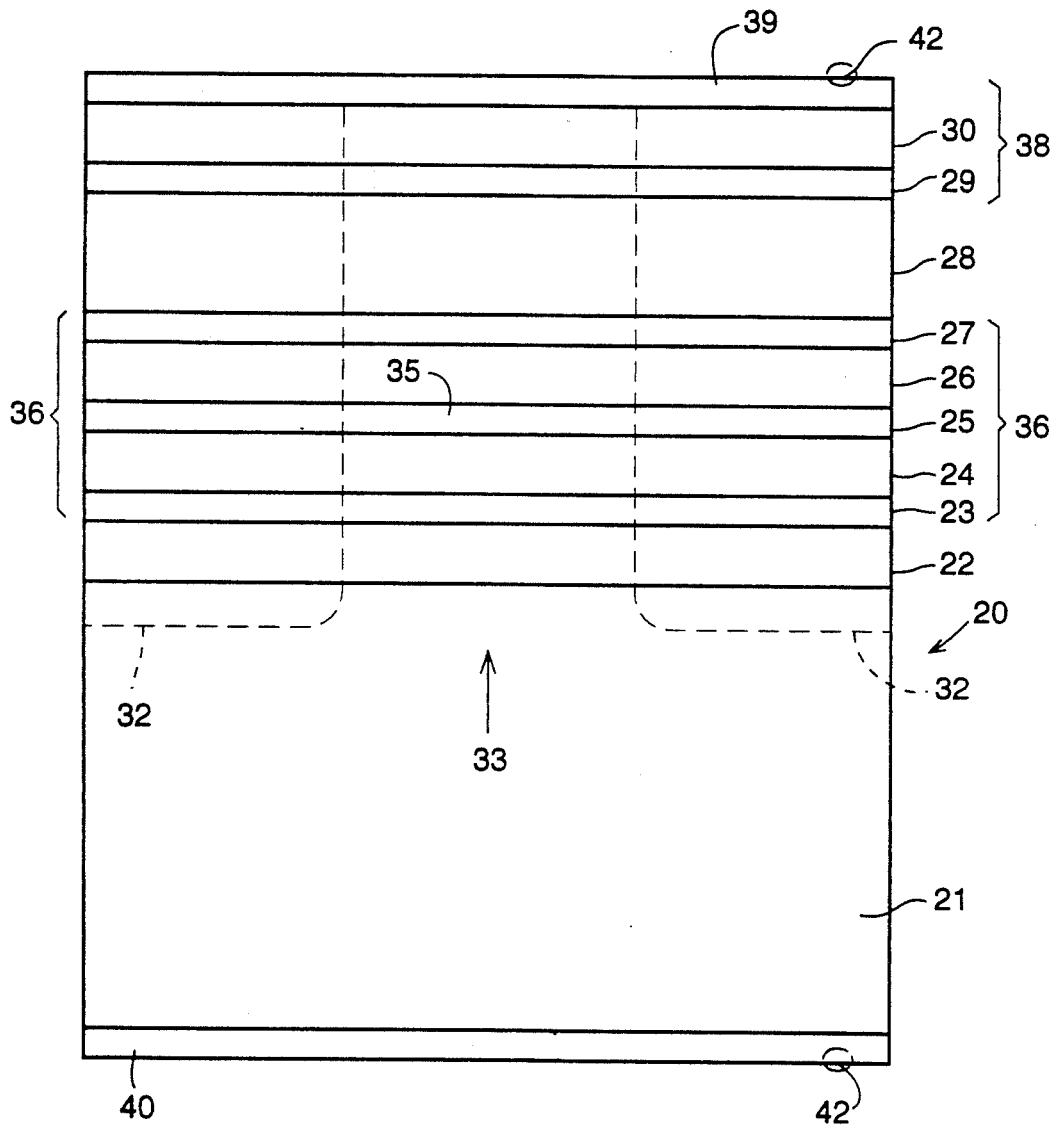
FIG. 1 is a schematic side view of one form of a semiconductor laser structure in accordance with the invention.

When impurity induced layer disordering (IILD) is practiced in the AlGaAs system, there is no possibility for strain driven generation of defect-containing layers of non-matched material as a result of the close similarity between the lattice constants of the two binary constituents, GaAs and AlAs. In visible light emitting AlGaInP material, on the other hand, the lattice parameter of the alloy is very strongly dependent on the composition ratio between the three binary constituents, AlP, GaP, and InP. Furthermore, since this alloy is commonly grown lattice matched to a GaAs substrate, many situations arise in which optimal device design would result with structures using interfaces between AlGaAs and AlGaInP. In such cases, devices based on IILD across such interfaces would require uniform and simultaneous disordering on both the column III and column V sublattices in order to avoid strain generation at the interface.

This observation has been verified computationally. In FIG. 2, we show the strain versus position and time in a layer structure in which interdiffusion occurs at the same rate on the column III and column V sublattices in a III-V alloy assuming a process could be developed to accomplish such interdiffusion. Thus, $D_{III}/D_V = 1$. The X-axis (horizontal) plots position across the interfaces, located at positions ±20 nm. The Y-axis (vertical) plots the fraction mismatch, and the Z-axis (angled to the right) is a plot of the logarithm to base 10 of the diffusion time measured in seconds. Computation shows that in a 40 nm thick layer, the maximum strain is only 200 ppm.

However, FIG. 2, unfortunately, does not represent a real world situation. In the real world, using conventional materials and dopants the interdiffusion coefficient for the III sites are two orders of magnitude greater than the corresponding coefficient on the column V sites. The result is that, under the same conditions depicted in FIG. 2, with an interdiffusion ratio of $D_{III}/D_V = 115$, in the same 40 nm thick layer, the maximum strain rockets to on the order of 10,000 ppm, shown in the computer simulation of FIG. 3. Defect generation would be expected in this case. The defects or dislocations, as is well known, will spoil many of the properties of the material, including specifically its light-emitting properties.

In accordance with one aspect of this invention, in a buried layer semiconductor structure comprising an active thin layer bounded by thick layers, by maintaining the thin layer thickness below a critical amount, a total reduction in the amount of resultant stress to below the level that detrimental defects or dislocations are generated can be achieved. For III-V layers containing P, we prefer to maintain the layer thickness at or below about 8 nm. With lattice matched layers of approximately 8 nm or less thickness, any amount of disordering can be introduced in the disordered region by IILD without generating defects or dislocations in the undisordered regions. However, the invention is not limited to 8 nm thick layers, since when layers are grown, strain can be built into them which will oppose the strain generated during interdiffusion, thereby increasing the maximum thickness of these layers before defects will occur.

Extensive modeling of the interdiffusion process at such interfaces shows clearly the development of the strain field over time as interdiffusion progresses in an initially lattice matched sample. With appropriate combinations of interdiffusion coefficients, the magnitude of this strain readily exceeds 3% in a sample that is initially in near perfect lattice match. In experiments performed to measure the actual enhanced interdiffusion coefficients for column III and column V interdiffusion, it has been found that in the case, for example, of Si enhanced interdiffusion at 850C, the rate of column III interdiffusion is approximately 100 times greater than column V interdiffusion. This disparity is shown to result in considerable interfacial and layer strain during the process of interdiffusion. Experiments have also been performed to establish the validity of our models, by interdiffusing GaInP layers of varying thickness into adjacent layers of GaAs by Si diffusion. We find that the resulting densities of misfit dislocations and threading dislocations are strongly dependent on layer thickness, and that there is a critical thickness of the GaInP layers below which no defects are generated during the interdiffusion process. This observation is explained in terms of conventional critical thickness analysis combined with the strain and interdiffusion models presented here.

Buried layer semiconductor structures based on this aspect of the invention will be characterized by a thin layer that serves a critical optoelectronic function, bounded by layers of different column III and V composition such that IILD will proceed in selected disordered regions with substantially different interdiffusion rates on the column III and V sites. Such a thin bounded layer must have a thickness to avoid below a critical thickness defect formation in the adjacent as-grown or undisordered regions. In the visible light emitting laser application, this thin buried layer will typically be the P-containing quantum well active layer. The quaternary alloy, AlGaInP, is preferred for this application in a layer thickness below 8 nm. As will be further explained below, maintaining the thin layer defect-free does not, by itself, ensure an efficiently-operating buried layer device. It is also essential that the thick bounding layers which are essential to device performance also be defect-free.

For an in depth analysis of the process of strain build-up and ultimate defect formation, along with an analysis of the energetic considerations involved in calculating the critical thickness, see the paper entitled "Strain And Defect Generation During Interdiffusion of GaAs Into $Al_{0.5}In_{0.5}P$", Appl. Phys. Lett., Vol. 16, No. 17, pp. 2060-2062, 1992.

Figure 6:
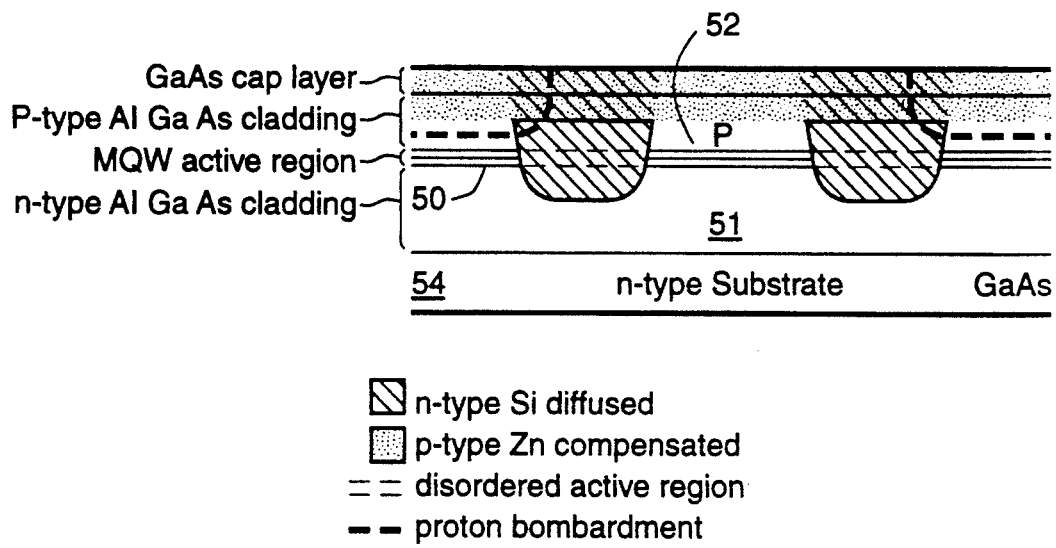
FIG. 6 shows in cross-section a typical known buried layer heterostructure laser.
Figure 7:
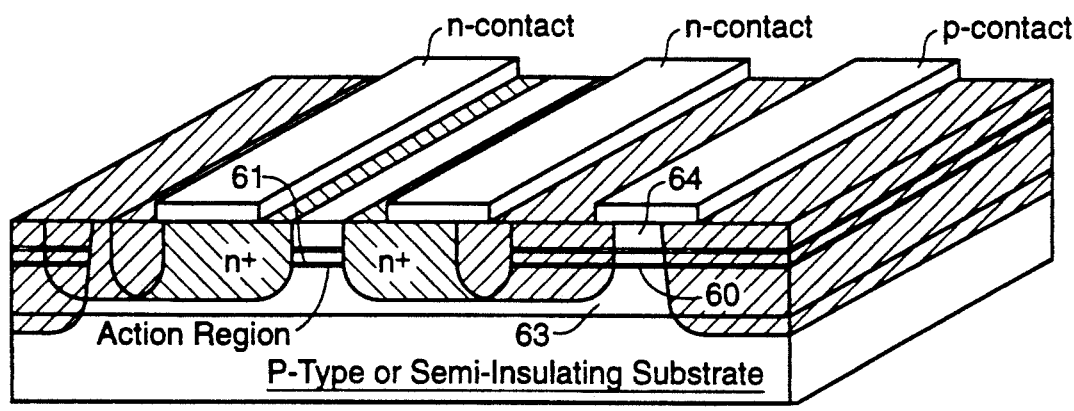
FIG. 7 shows in cross-section a typical known buried layer hybrid laser/transistor device.

Examples of the class of buried-layer devices to which the present invention applies are illustrated in FIGS. 6 and 7, which correspond to FIGS. 3 and 6 of the 1991 SPIE paper. FIG. 6 illustrates a typical known buried layer heterostructure laser fabricated by IILD. The hatching is explained in the drawing, and the key layers have been labelled. In this instance, the active thin layer 50 is constituted by multiple quantum well layers, each typically 80 Å (8 nm) thick. The thin active layer 50 is bounded on both sides lower and upper by cladding layers 51, 52. The thick cladding layers would always exceed 45 nm in thickness and usually are much thicker. As mentioned earlier, by using GaAs as the substrate 54, the AlGaAs cladding layers 51,52 are very closely lattice-matched to the substrate 54 and there is no risk of defect generation in the thick bounding layers 51, 52. In the FIG. 6 structure, when potentials are applied via upper and lower electrodes (not shown), light is emitted from the active MQW region 50 between the laterally-spaced, hatched, IILD regions.

FIG. 7 illustrates a hybrid laser/transistor device buried layer structure. The laser is a so-called surface skimming laser, and the transistor is a lateral heterojunction bipolar transistor. Both operate via lateral current flow in the active region through Si diffused, IILD, n-type regions, indicated in the figure by the labels. The thin active region 60 for the laser comprises quantum well layers. The thin active region 61 for the transistor is the base region. The thin active regions 60, 61 are bounded on both lower and upper sides by thick regions 63, 64 which have also to be defect-free for good device performance.

There can be several thin buried layers in the buried layer device of the invention. If they butt one another, as in FIG. 6, then their combined thickness should not exceed the critical maximum thickness. If the two or more thin layers are separated such that they do not communicate with each other, such as by a thick layer, then the maximum thickness requirement applies to each of them separately.

A reason why multiple thin buried layers would be desirable is that they each can perform the same or different functions. For example, multiple thin layers can serve as a multiple quantum well active region determining the light emission properties. For example, with GaInP thin layers, then the bandgap is reasonably high, say 1.91 eV, and a laser diode would emit in the visible light range.

The thin layers can also perform carrier confinement or light wave guiding functions in which case it requires a composition providing a higher bandgap than that of the quantum well layer, to prevent carriers from spilling out of the quantum well layer. From the optical waveguide standpoint, if the bandgap difference is insufficient, the waveguide mode is too weak, the optical field will spread too far, and there will be inefficient pumping of the light in the active lasing layer.

These desired results are readily obtained in the preferred embodiments with a defect-free structure where each buried thin layer is bounded below and above entirely by thicker layers exceeding 45 nm in thickness and that are substantially lattice matched to the substrate.

FIG. 1 illustrates one form of quantum well laser in accordance with one aspect of the invention. The basic geometry is based on a prior art striped laser structure, modified compositionally and in layer thicknesses to avoid excessive strain resulting in defect generation during subsequent processing. The laser example shown, which is not meant to be limiting, comprises semiconductor body portion 20 with the following regions, and their functions, produced by conventional fabrication techniques. In the example given, a single crystal substrate 21, for example, of GaAs, is provided, on which is epitaxially grown, in order: a cladding layer 22, for example of AlGaAs; a first P-containing barrier layer 23, for example AlGaInP; a first wide bandgap waveguide confining layer 24, for example, of AlGaAs; a thin quantum well layer 25, for example of GaInP; a second wide bandgap waveguide confining layer 26, for example, of AlGaAs; a second P-containing barrier layer 27, for example, of AlGaInP; another cladding layer 28, for example of AlGaAs; and two cap layers 29, 30, for example of GaAs. In this example, the thin QW layer 25 is bounded on both sides by thick waveguide confining layers 24,26. The thin barrier layers 23, 27 are each bounded on its inner side by a thick waveguide confining layer 24, 26, and on its outer side by thick cladding layers 22, 28. With the GaAs substrate 21, the four mentioned thick layers 22, 24, 26, 28, all of AlGaAs, are lattice matched to the substrate and thus defect-free.

The regions along opposite sides, within the dashed lines 32, illustrate the areas affected by the influence of propagating dislocation effects during the process of IILD within these regions and are referred to herein as disordered regions or portions. However, the central region indicated by 33 will not become disordered and will remain the same as originally deposited, referred to herein as undisordered or as-grown regions or portions. The disordered regions 32 formed at both sides lateral will form the desired high bandgap p-n junction and low refractive index regions relative to that of the central portion 33, resulting in the desired formation of an index waveguide region defined by a channel 35 between portions 36 of the laser 20. The '893 patent explains in detail the functions of these regions.

The structure shown may be completed in the usual way by a selective proton or ion implant through the caps to form a stripe 38. The laser is completed with the usual deposited metal contacts 39, and 40 at top and bottom.

The front and back sides, parallel to the drawing plane, are cleaved to form the usual reflecting surfaces, with added transparent reflective coatings. When current is applied via the connections 42, the structure will lase, with the light output being perpendicular to the drawing plane along the channel 35.

It will be understood that this structure is but one of many known laser geometry structures that can be used to implement the invention and the invention is not limited thereto. For example, single or multiple quantum well structures can be used. Other examples are illustrated in the patents referenced above.

FIG. 4 illustrates in more detail on the right side a device geometry in accordance with the invention, and for comparison purposes, on the left side, a conventional prior art construction corresponding to that described in the referenced Ikeda paper. Where significant, refractive index and thicknesses are given for specific compositions, but the invention is not limited to those particular values. The same reference numerals for the right hand side are used as in FIG. 1, and primed numerals are used for any corresponding parts on the left side.

Both structures result in single quantum well DH laser structures that will emit in the visible range, namely, at about 650 nm, with very similar waveguide properties. The conventional structure on the left employs relatively thick (0.2 mm) AlGaInP waveguides 24', 26', bounding the GaInP thin 80 Å well layer 25.

In contrast, the inventive structure on the right substitutes for the thick P containing layers 24', 26', on both sides, the combination of a relatively thin 80 Å AlGaInP barrier layer 23, 27 with a much thicker 700 Å non-P-containing AlGaAs layer 24, 26.

The resultant laser structure, in accordance with this aspect of the invention, not only avoids defect generation due to the thin (80 Å) AlGaInP barrier layers and GaInP quantum wells forming the IILD interfaces, but also has the important advantage that it provides minimal thickness to the layers of phosphorus containing alloy, with minimal sacrifice to the carrier confinement and wide direct bandgap light emission functions for which these layers are necessary. This result is possible because of the fact that AlGaAs can be substituted, and because comparably large, although indirect, bandgaps to those in AlGaInP are achievable in AlGaAs, albeit with a much earlier direct indirect transition and a somewhat lower maximum bandgap achievable. Hence, some of the functionality previously furnished by the thick AlGaInP layers can be furnished by relatively thick AlGaAs layers 24, 26 which will not exhibit the same strain generation problem. Hence, minimal sacrifice need be made in performance of the laser.

It is again emphasized that, though specific compositions, refractive indices, bandgap, and layer thicknesses are given in the FIG. 4 example, the invention is not limited thereby. The values for the most part are conventional and those skilled in this art will fully understand that other compositions and thicknesses can be substituted without departing from the spirit and scope of this invention. An important element that must be maintained is that the barrier layers and active layer with the phosphorus are kept at or below the critical thickness for this material of about 8 nm, and that the bounding thick layers are also maintained defect-free. The thick layers will have a thickness exceeding 45 nm. In the examples so far given, they are 70 nm thick. A preferred range is 45–140 nm, but the upper end can be exceeded.

In the FIG. 4 structures, both the conventional (on the left) and the reduced thickness column V phosphorus structures (on the right) will emit at 650 nm with very similar waveguide properties. The reduced column V-P structure requires barrier layers of wide gap to achieve necessary carrier confinement. These layers may be thicker, or replace the $Al_{0.5}Ga_{0.5}As$ waveguides, depending on critical thickness under disordering. In the scenario above, the total quaternary content of the structure is three 80 Å layers separated by 700 Å layers.

Figure 5:
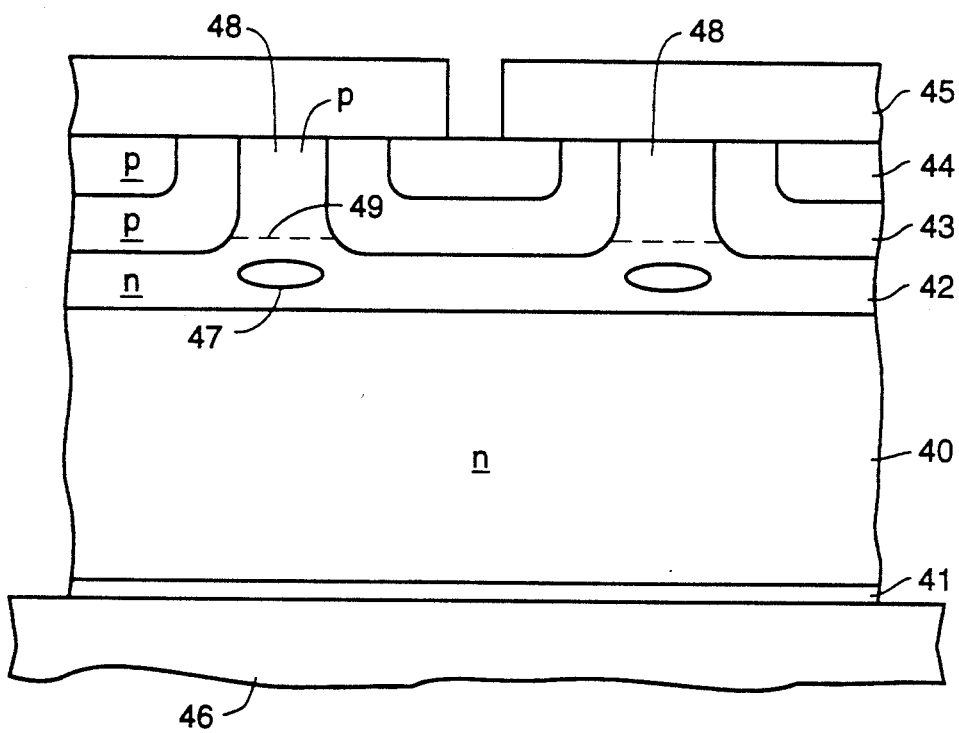
FIG. 5 shows in a side view a 2-element laser array in accordance with the invention.

The general reduction in the thickness of the critical AlGaInP layers is also useful for improvement of the heat sinking of the laser structure. This is an especially important consideration when the device is mounted p-type-side up on a heatsink as is most desirable for independently addressable lasers. FIG. 5 schematically illustrates a simplified 2-element laser array of the type described in the '893 patent, with the semiconductor structure mounted p-type-side up for CW operation. The details of the structure, shown in FIGS. 1 and 4, have been omitted for clarity from FIG. 5. Suffice to say, the structure comprises an n-type substrate 40, with the usual contact 41 at the bottom, and the epitaxially-grown layers of which layer 42 is also n-type, but the disordered regions 43, 44, also p-dopant diffused, are p-type and define two current pumping channels 48. The active lasing region is indicated by the circles at 47, and a p-n junction at 49. The usual heatsink 46 supports the structure. For more details on the structure, reference is had to the '893 patent, which also explains the benefits of the p-side up mounting.

A feature of the present invention is that, by substituting relatively thick AlGaAs regions (24, 26 in FIG. 4) with thin AlGaInP layers (23, 27 in FIG. 4), for the thicker AlGaInP layers in the prior art (24', 26', in FIG. 4), the benefit is obtained that the thermal conductivity of AlGaAs is substantially greater than that of AlGaInP. As a result, laser cladding layers made out of AlGaAs would provide improved heatsink capacity relative to AlGaInP cladding layers, thereby relaxing the constraints on laser conversion efficiency necessary in order to achieve reliable p-type-side up operation.

In accordance with a further feature of the invention, a further advantage of the proposed minimization of the total thickness of quaternary layers in the laser structure is that the device is amenable to processing similar to that used in infrared IILD devices, subject to the aforementioned constraints regarding strain generation. Specifically, layer electrical and doping properties would be identical to those in infrared emitting laser devices. As a specific example, AlInP is a highly desirable component in a visible light emitting laser system as a result of its wide bandgap. It is, however, the most difficult of all of the components in the visible laser structure to effectively dope p-type. AlGaAs, on the other hand, is somewhat narrower in bandgap, (for 85% Al) but has comparable refractive index, better thermal conductivity and superior p-type doping. With appropriately designed quaternary barrier layers to circumvent the narrower bandgap of this material, its beneficial materials properties can be put to good use.

Specifically, the laser structure shown in FIG. 4 at the right suggests itself, where the device active layers composed of AlGaInP are minimized in thickness and the entire balance of the structure is grown in AlGaAs. This benefit, which is separate and apart from the defect/generation problem, can be exploited in structures other than lasers based on IILD.

In implementing this aspect of the invention, the AlGaAs should be given a high Al content, preferably exceeding 75%, to obtain a low refractive index comparable to that of the replaced AlInP. High levels of p-type doping, of the order of $10^{19}/cm^3$ or higher are easily achieved in AlGaAs by conventional dopant techniques.

The fabrication of buried layer devices in accordance with the invention will be evident to those skilled in this art from the detailed descriptions given in the cited references. Attention is particularly drawn to FIG. 10 of the 1991 SPIE paper, the referenced patents, and the following books which contain chapters on specific methods for epitaxially growing the thin and thick layers for the buried layer device of the invention in a defect-free manner: "GaInAsP Alloy Semiconductors", edited by Pearsall, published by John Wiley & Son, specifically pp. 61-106, and "Heterostructure Lasers", by Casey, Jr. and Panish, Academic Press, Chapter 6, especially 6.6 and 6.7.

Summarizing, the buried layer devices of the invention, especially in the laser application, will have thin Q-well and barrier layers 7-8 nm thick or less. They will be bounded by thick carrier confinement layers of wider bandgap, usually exceeding 45 nm in thickness. For visible light emission, the Q-well layers contain P. By keeping the thin active regions below a critical thickness, defects due to IILD in adjacent areas are avoided. By lattice matching the thick layers to the substrate, defects in the thick layers are avoided. There follows below a description of preferred compositions in the III-V system that will ensure defect-free structures that will perform efficiently.

| Substrate | Thin Layer | Thick Layer | Remarks |
|---|---|---|---|
| GaAs | AlGaInP | AlGaAs | Visible light laser |
| InP | InGaAs | InGaAlP | Infrared laser |
| GaAs | InGaAs | GaAlP | |
| InAs | InAsSb | GaAlAsSb | Long wavelength for communications |

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set for the above as such variations and modifications are intended to be included within the scope of the appended claims.

What is claimed is:

1. A semiconductor buried layer structure comprising a body portion having a plurality of regions made up of Column III-Column V constituent crystal or mixed crystal compounds and including:

a substrate, on the substrate a first layer having interfaces with second and third layers and containing at first disordered portions impurity induced layer disordering across said interfaces due to changes in both the Column III and the Column V constituents of said first layer, said first layer exhibiting at adjacent second undisordered portions desired properties due to such impurity induced layer disordering but a tendency to generate defects which spoil said properties as a result of stress generated by the impurity induced layer disordering at the first portions, means for preventing the generation of property-spoiling defects at the second portions in said structure, said means comprising maintaining said first layer below a critical thickness for the strained layer resulting when the regions are interdiffused, said first layer being bounded entirely by said second and third layers each exceeding 450 Å in thickness.

2. The structure of claim 1, wherein each of said second and third layers are sufficiently closely lattice matched to the substrate such that said semiconductor body regions remain substantially free of defects.

3. The structure of claim 1, wherein the second and third layers have a maximum thickness of 1400 Å.

4. The structure of claim 1, wherein the first layer contains phosphorus.

5. The structure of claim 4, wherein the only phosphorus-containing layer in the semiconductor body region is the first layer.

6. A laser diode comprising the structure of claim 1, optical cavity forming means, and current supplying means for injecting carriers into the second portions of the structure.

7. The diode of claim 6, wherein the laser diode emits visible light.

8. A bipolar transistor comprising the structure of claim 1, emitter and collector regions adjacent to the second portions, and connections to the emitter and collector regions and to the second portions.

9. A visible light-emitting semiconductor laser based on impurity induced layer disordering and having electrodes and a resonant cavity and comprising:

a semiconductor body portion made up of column III-Column V constituent crystal or mixed crystal compound regions, where the Column III constituent is selected from the group consisting of Ga, Al, and In, and the Column V constituent is selected from the group consisting of As, P, and Sb;

said body portion comprising a first acting as a substrate, over the first region second and third layers for optical guiding and carrier confining functions, a fourth layer located between the second and third layers and constituting the active laser region, said fourth layer containing at first portions Column III or Column V impurities in quantities sufficient to produce impurity induced layer disordering, the impurity induced layer disordering tending to cause strain generation at adjacent second portions of the fourth layer, said fourth layer having a thickness below a maximum value and such that said fourth layer remains substantially free of defects, said second and third layers also being substantially defect-free.

10. The semiconductor laser of claim 9, wherein the fourth layer includes phosphorus.

11. The semiconductor laser of claim 10, wherein the fourth layer is the only layer containing phosphorus.

12. The semiconductor laser of claim 9, wherein the fourth layer is a quaternary compound, and second and third layers are ternary compounds.

13. The semiconductor laser of claim 12, wherein the fourth layer comprises AlGaInP, and the second and third layers each comprises AlGaAs, and the substrate is GaAs.

14. The semiconductor laser of claim 9, wherein the maximum value of thickness of the fourth layer is 8 nm.

15. The semiconductor laser of claim 9, wherein the second and third layers are lattice-matched to the substrate.

16. A semiconductor device having electrodes and comprising:

a semiconductor body portion made up of column III-Column V constituent crystal or mixed crystal compound regions, where the Column III constituent is selected from the group consisting of Ga, Al, and In, and the Column V constituent is selected from the group consisting of As, Sb and P;

said body portion comprising a first p-type-region comprising AlInP, adjacent the first region a second region comprising AlGaAs, said second region having p-type doping that is relatively high compared to that of the first region.

17. The semiconductor device of claim 16, wherein the second region is thicker than the first region.

18. The semiconductor device of claim 17, wherein the second region has an Al content exceeding 60%.

19. The semiconductor device of claim 17, wherein the second region has a lower refractive index compound to that of the first region.

20. A light-emitting semiconductor laser based on impurity induced layer disordering and having elements and a resonant cavity and comprising:

a semiconductor body portion made up of column III-Column V constituent crystal or mixed crystal compound regions, where the Column III constituent is selected from the group consisting of Ga, Al, and In, and the Column V constituent is selected from the group consisting of As, Sb and P;

said body portion comprising a substrate, a first layer located between and bounded by second and third layers and with the first layer constituting a quantum well layer serving as the active laser region, said layers having first portions containing Column III or Column V impurities in quantities sufficient to produce impurity induced layer disordering, said first layer having a thickness below about 8 nm, said second and third layers having a thickness exceeding 45 nm and serving as confinement layers for the quantum well layer, said body portion being substantially defect-free.

21. The semiconductor laser of claim 20, further comprising a heat sink, said body portion having a p-type doped region and being mounted on said heat sink with the p-type doped region up.

22. The device of claim 20, wherein when the substrate is GaAs, the first layer is AlGaInP, and the second and third layers are AlGaAs or GaAlP; and when the substrate is InP, the first layer is InGaAs, and the second and third layers are InGaAlP;

23. A light-emitting semiconductor laser based on impurity induced layer disordering and having electrodes and a resonant cavity and comprising:

a semiconductor body portion made up of column III-Column V constituent crystal or mixed crystal compound regions, where the Column III constituent is selected from the group consisting of Ga, Al, and In, and the Column V constituent is selected from the group consisting of As, P, and Sb;

said body portion comprising a first region acting as a substrate, over the first region second and third layers for optical guiding and carrier confining functions, a fourth region located between the second and third layers and constituting the active laser region, said fourth layer containing at first portions Column III or Column V impurities in quantities sufficient to produce impurity induced layer disordering, the impurity induced layer disordering tending to cause strain generation at adjacent portions of the fourth layer, said fourth layer having a thickness below a maximum value and such that said fourth layer remains substantially free of defects, said second and third layers also being substantially defect-free, said fourth layer comprising AlGaInP.

24. The semiconductor laser of claim 23, wherein the fourth layer is the only layer comprising AlGaInP.

25. The semiconductor laser of claim 23, wherein the second and third layers each comprises AlGaAs.

26. A semiconductor device having electrodes and comprising:

a semiconductor body portion made up of column III-column V constituent crystal or mixed crystal compound regions, where the Column III constituent is selected from the group consisting of Ga, Al, and In, and the Column V constituent is selected from the group consisting of As, Sb and P;

said body portion comprising a first QW region, adjacent the first region second and third regions comprising AlGaAs, said second region having p-type doping of the order of $10^{19}/cm^3$ or higher.

27. The semiconductor device of claim 26, wherein the second and third regions are thicker than the first region.

28. The semiconductor device of claim 27, wherein the second and third regions each have an Al content exceeding 60%.

* * * * *